US011189645B2

United States Patent
Kitagawa et al.

(10) Patent No.: US 11,189,645 B2
(45) Date of Patent: Nov. 30, 2021

(54) ACTIVE MATRIX SUBSTRATE AND LIQUID CRYSTAL DISPLAY DEVICE

(71) Applicant: Sharp Kabushiki Kaisha, Sakai (JP)

(72) Inventors: Hideki Kitagawa, Sakai (JP); Hajime Imai, Sakai (JP); Toshikatsu Itoh, Sakai (JP); Tetsuo Kikuchi, Sakai (JP); Masahiko Suzuki, Sakai (JP); Teruyuki Ueda, Sakai (JP); Kengo Hara, Sakai (JP); Setsuji Nishimiya, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 149 days.

(21) Appl. No.: 16/497,505

(22) PCT Filed: Mar. 26, 2018

(86) PCT No.: PCT/JP2018/012061
§ 371 (c)(1),
(2) Date: Sep. 25, 2019

(87) PCT Pub. No.: WO2018/181142
PCT Pub. Date: Oct. 4, 2018

(65) Prior Publication Data
US 2021/0305280 A1 Sep. 30, 2021

(30) Foreign Application Priority Data
Mar. 31, 2017 (JP) .............................. JP2017-071773

(51) Int. Cl.
*H01L 27/12* (2006.01)
*G02F 1/1362* (2006.01)

(52) U.S. Cl.
CPC ...... *H01L 27/124* (2013.01); *G02F 1/136277* (2013.01); *H01L 27/1237* (2013.01); *H01L 27/1251* (2013.01)

(58) Field of Classification Search
CPC ............... H01L 27/124; H01L 27/1251; H01L 27/1237; G02F 1/136277
See application file for complete search history.

(56) References Cited

U.S. PATENT DOCUMENTS

2002/0163016 A1   11/2002   Shibata
2009/0323005 A1   12/2009   Ota
(Continued)

FOREIGN PATENT DOCUMENTS

JP   2002-319679 A   10/2002
JP   2010-008758 A   1/2010

*Primary Examiner* — Eugene Lee
(74) *Attorney, Agent, or Firm* — Keating & Bennett, LLP (57) ABSTRACT

There is provided a high-definition active matrix substrate while suppressing an occurrence of pixel defects. The active matrix substrate includes a first semiconductor film corresponding to one of two sub-pixels adjacent to each other in a row direction, a second semiconductor film corresponding to the other of two sub-pixels, a transistor using part of the first semiconductor film as a channel in the row direction, and a pixel electrode connected to a drain electrode of the transistor through a contact hole. In a plan view, a distance (dc) in the row direction from a drain electrode-side edge of the channel to a bottom surface of the contact hole is 0.15 or more times a sub-pixel pitch (dp) in the row direction.

19 Claims, 6 Drawing Sheets

(56) References Cited

U.S. PATENT DOCUMENTS

| | | | |
|---|---|---|---|
| 2014/0027728 A1* | 1/2014 | Yoon | H01L 33/08 |
| | | | 257/40 |
| 2016/0064700 A1* | 3/2016 | Pyon | H01L 27/3276 |
| | | | 257/40 |
| 2016/0358943 A1* | 12/2016 | Okada | G02F 1/1368 |
| 2017/0358605 A1* | 12/2017 | Choi | H01L 27/3272 |
| 2020/0089068 A1* | 3/2020 | Kim | H01L 27/14605 |
| 2021/0202906 A1* | 7/2021 | Kim | H01L 27/3293 |

* cited by examiner

ACTIVE MATRIX SUBSTRATE AND LIQUID CRYSTAL DISPLAY DEVICE

TECHNICAL FIELD

The present invention relates to an active matrix substrate.

BACKGROUND ART

In PTL 1, a liquid crystal display device is disclosed, which includes a TFT, a pixel electrode, and a common electrode having a slit, and in which the pixel electrode and a drain electrode of the TFT are connected at a contact hole.

CITATION LIST

Patent Literature

PTL 1: Japanese Unexamined Patent Application Publication No. 2010-8758 (released on Jan. 14, 2010)

SUMMARY OF INVENTION

Technical Problem

There is a problem that pixel defects increase as a distance between a TFT and a contact hole is reduced for higher definition.

Solution to Problem

The active matrix substrate according to one aspect of the present invention includes a first semiconductor film corresponding to one of two sub-pixels adjacent to each other in a row direction, a second semiconductor film corresponding to the other of two sub-pixels, a transistor using part of the first semiconductor film as a channel in the row direction, and a pixel electrode connected to a drain electrode of the transistor through a contact hole. In a plan view, a distance in the row direction from a drain electrode-side edge of the channel to a bottom surface of the contact hole is 0.15 or more times a sub-pixel pitch in the row direction.

Advantageous Effects of Invention

According to the active matrix substrate of one aspect of the present invention, higher definition can be achieved while suppressing an occurrence of pixel defects.

DESCRIPTION OF EMBODIMENTS

Hereinafter, an embodiment of the present invention will be described based on FIGS. 1 to 7. However, embodiments are not limited to the examples.

Figure 1:
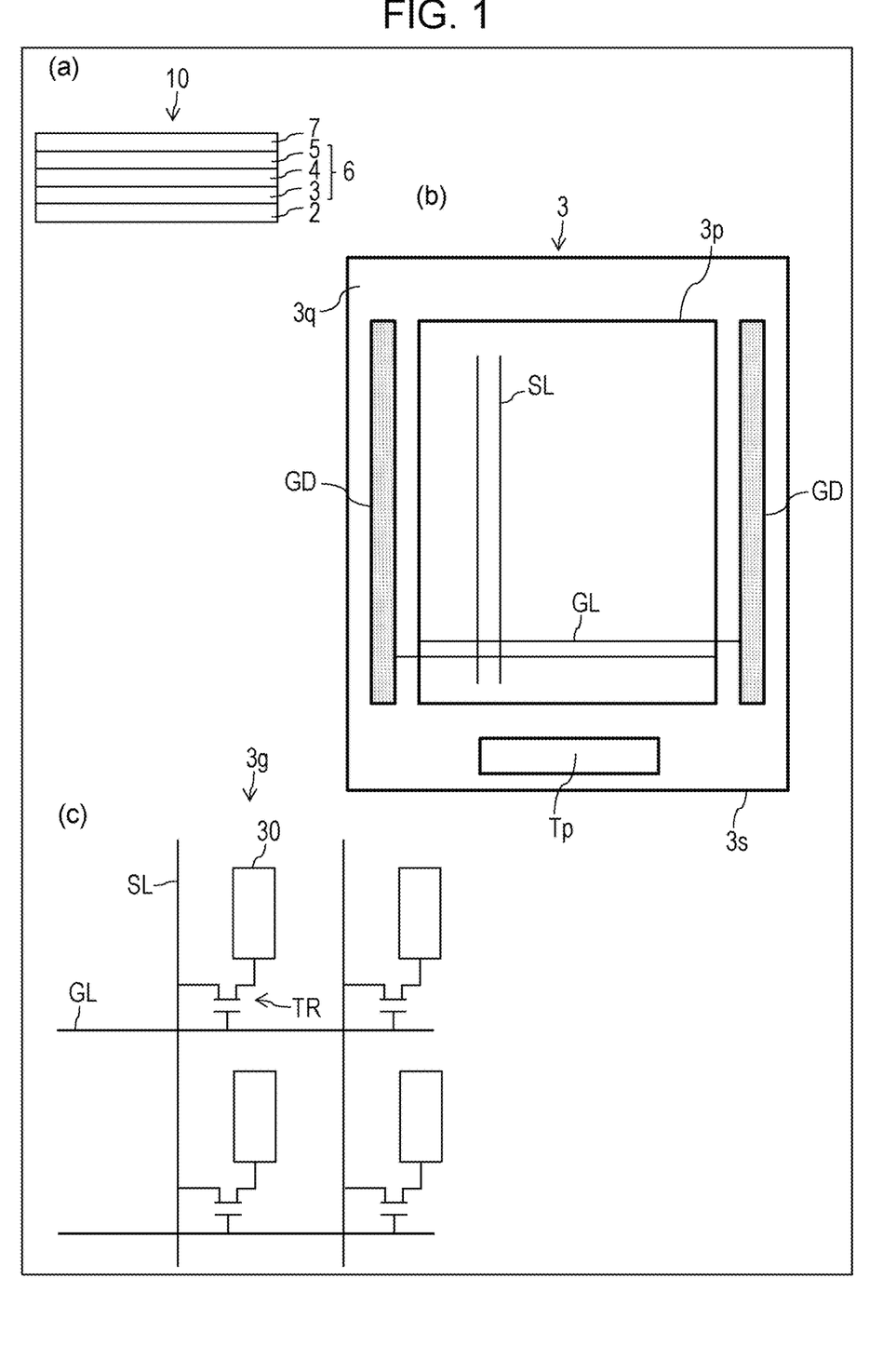
FIG. 1 shows a configuration of a display device according to the present embodiment, (a) of FIG. 1 is a cross-sectional schematic view showing an entire configuration, (b) of FIG. 1 is a plan view schematic diagram showing the entire configuration, and (c) of FIG. 1 is a circuit diagram showing a pixel circuit of a display portion.

FIG. 1 shows a configuration of a display device according to the present embodiment, (a) of FIG. 1 is a cross-sectional schematic view showing an entire configuration, (b) of FIG. 1 is a plan view schematic diagram showing the entire configuration, and (c) of FIG. 1 is a circuit diagram showing a pixel circuit of a display portion.

As shown in FIG. 1, a liquid crystal display device 10 according to the present embodiment includes a backlight unit 2, a liquid crystal panel 6 having an active matrix substrate 3, a liquid crystal layer 4 and a color filter substrate 5, and an optical film 7.

A display portion 3$p$ of the active matrix substrate 3 includes a pixel electrode 30, a transistor TR, a data signal line SL, and a scanning signal line GL, and in a pixel circuit 3$g$, the pixel electrode 30 is connected to the data signal line SL and the scanning signal line GL through the transistor TR. The active matrix substrate 3 is configured in a fringe-field switching (FFS) mode including a common electrode (not shown) facing the pixel electrode 30, and an in-cell touch sensor is configured using the common electrode.

A non-display portion (inactive portion) 3$q$ of the active matrix substrate 3 is provided with a gate driver (drive circuit) GD for driving the scanning signal line GL and an IC chip Tp including a source driver for driving the data signal line SL. The gate driver GD and the pixel circuit 3$g$ may be monolithically formed on the same substrate 3$s$.

Figure 2:
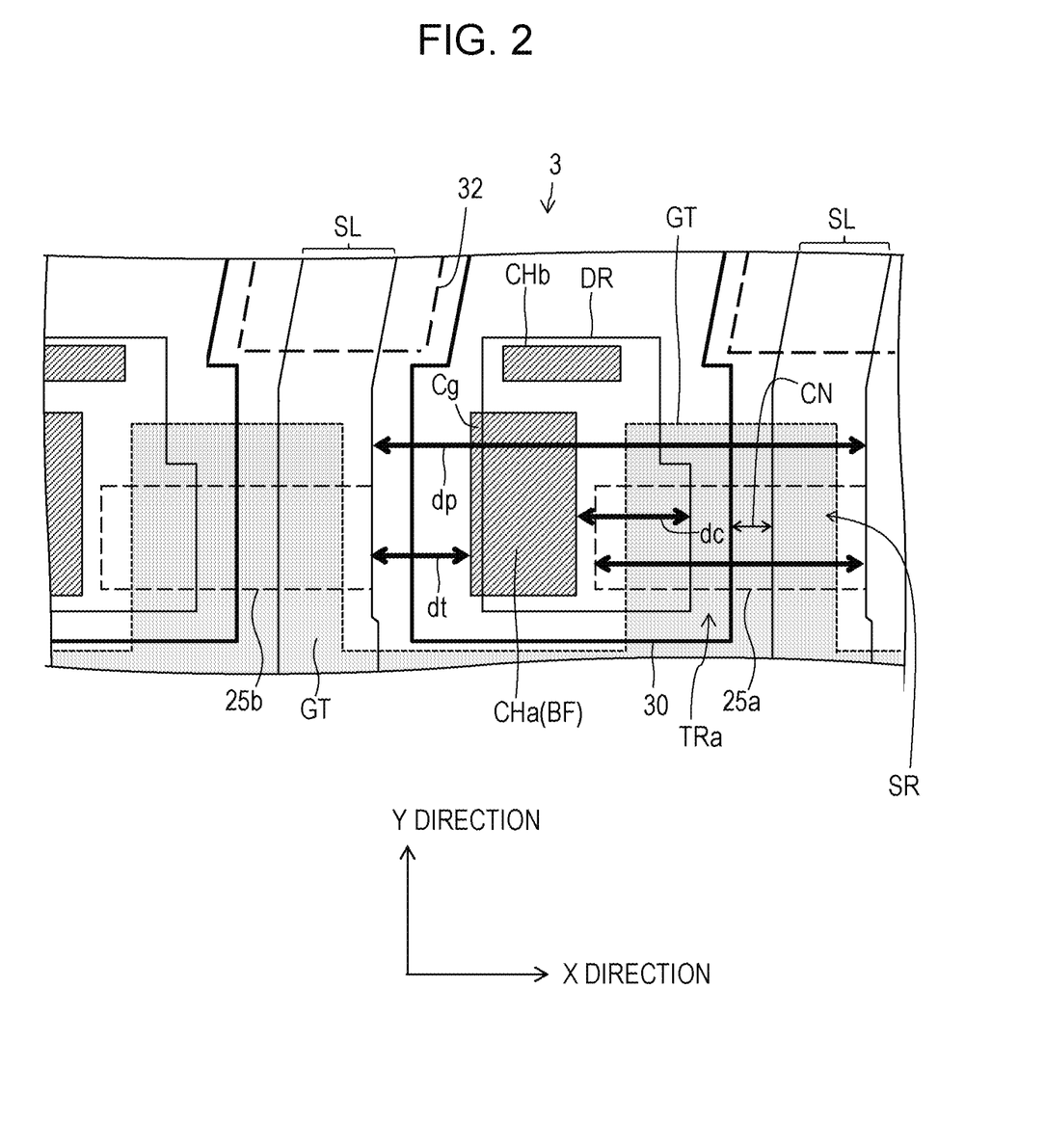
FIG. 2 is a plan view showing a configuration of a display panel according to embodiment 1.
Figure 3:
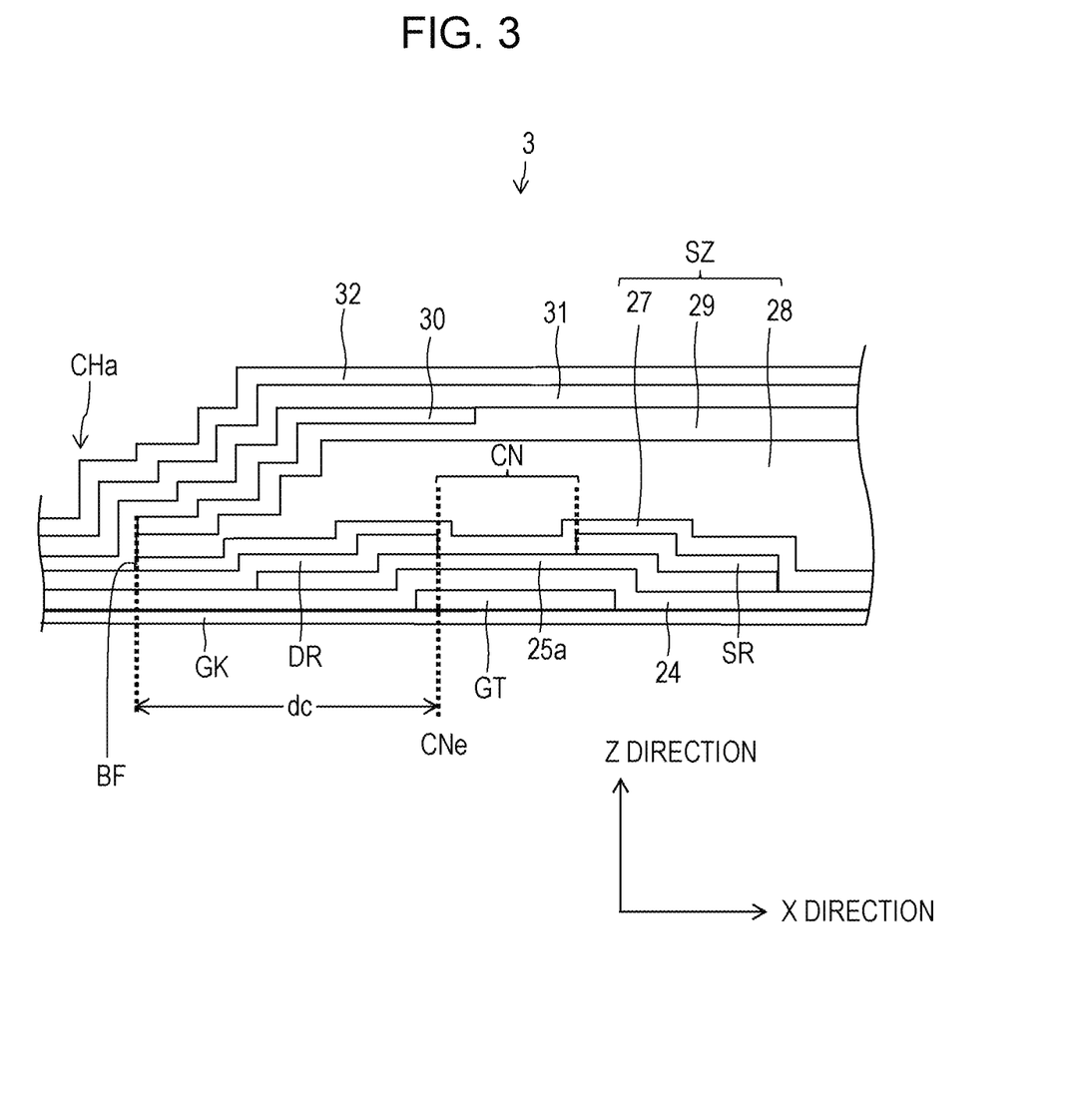
FIG. 3 is a cross-sectional view showing the configuration of the display panel according to the embodiment 1.

FIG. 2 is a plan view showing a configuration of a display panel according to the embodiment 1, and FIG. 3 is a cross-sectional view showing the configuration of the display panel according to the embodiment 1.

The active matrix substrate 3 includes a first semiconductor film 25$a$ corresponding to one of two sub-pixels adjacent to each other in a row direction, a second semiconductor film 25$b$ corresponding to the other of two sub-pixels, a transistor TRa using part of the first semiconductor film 25$a$ as a channel in the row direction, and a pixel electrode 30 connected to a drain electrode DR of the transistor TRa through a contact hole CHa.

The transistor TRa has a bottom gate structure, and a gate electrode GT is formed of, for example, a laminated film of titanium (Ti) and copper (Cu) on a glass substrate GK. The gate electrode GT is part of the scanning signal line GL.

A gate insulating film 24 is formed to cover the gate electrode GT. The gate insulating film 24 is made of, for example, silicon nitride (SiNx) or silicon dioxide (SiO2).

The first semiconductor film 25$a$ and the second semiconductor film 25$b$ are formed on the gate insulating film 24. The first semiconductor film 25$a$ and the second semiconductor film 25$b$ are, for example, oxide semiconductor films, and may contain at least one metal element of In, Ga, and Zn. In the present embodiment, the first semiconductor film 25$a$ and the second semiconductor film 25$b$ include, for example, an In—Ga—Zn—O based semiconductor. The In—Ga—Zn—O based semiconductor is a ternary oxide of indium (In), gallium (Ga), and zinc (Zn), and the ratio (composition ratio) of In, Ga and Zn is not particularly limited, includes, for example, In:Ga:Zn=2:2:1, In:Ga:Zn=1:1:1, In:Ga:Zn=1:1:2, and the like.

A source electrode SR and the drain electrode DR of the transistor TRa are formed of, for example, a laminated film of titanium (Ti) and copper (Cu) so as to be separated from each other on the first semiconductor film 25*a*. The source electrode SR is part of the data signal line SL.

An inorganic insulating film 27 is formed of, for example, silicon nitride (SiNx) or silicon dioxide (SiO2) so as to cover the source electrode SR and the drain electrode DR. On the inorganic insulating film 27, a planarization film 28 which is an organic insulating film is formed of, for example, an acrylic resin material such as polymethyl methacrylate resin (PMMA).

The pixel electrode 30 is formed on the planarization film 28 through an inorganic insulating film 29. In addition, a common electrode 32 is formed on the pixel electrode 30 through an inorganic insulating film 31. The pixel electrode 30 and the common electrode 32 are transparent electrodes, and are made of, for example, a material such as Indium Tin Oxide (ITO), Zinc Oxide (ZnO), Indium Zinc Oxide (IZO), Indium Gallium Zinc Oxide (IGZO), and Indium Tin Zinc Oxide (ITZO), or the like.

An Interlayer insulating film SZ is formed of the inorganic insulating film 27, the planarization film 28 and the inorganic insulating film 29, and the drain electrode DR and the pixel electrode 30 are connected by two contact holes CHa and CHb penetrating the interlayer insulating film SZ.

[Embodiment 1]

FIG. 2 is the plan view showing the configuration of the display panel according to the embodiment 1.

FIG. 3 is the cross-sectional view showing the configuration of the display panel according to the embodiment 1.

FIG. 2 and FIG. 3 show a 5-inch full HD liquid crystal panel (pixel density is 441 ppi).

In the embodiment 1, in a plan view, a distance dc in the row direction (X direction in FIG. 2) from a drain electrode-side edge Ce of a channel CN of the transistor TRa to a bottom surface BF of the contact hole CHa is 0.154 or more times (for example, 2.96 µm) a sub-pixel pitch dp (for example, 19.2 µm) in the row direction. In FIG. 2 and FIG. 3, the distance dc is 0.234 times (for example, dc=4.49 µm) the sub-pixel pitch dp as a more preferable configuration.

The contact hole CHa penetrating the interlayer insulating film SZ has a forward tapered shape (the bottom surface is smaller than the opening surface) tapered toward the bottom side (the glass substrate side). The distance dc is 1.2 or more times a thickness (for example, 2.8 µm) of the interlayer insulating film SZ, and is 1.6 times as a more preferable configuration in FIG. 2 and FIG. 3.

A length in the row direction of the first semiconductor film 25*a* is 0.45 or more times a pixel pitch. In FIG. 2 and FIG. 3, the length is 0.55 times (for example, 10.6 µm) the pixel pitch as a more preferable configuration. Further, the first and second semiconductor films 25*a* and 25*b* are arranged in the row direction with a gap less than 0.48 times the sub-pixel pitch dp. In FIG. 2 and FIG. 3, the gap is 0.45 times (for example, 8.6 µm) as a more preferable configuration.

A width in the row direction of the bottom surface BF of the contact hole CHa is 0.21 or more times the sub-pixel pitch dp. In FIG. 2 and FIG. 3, the width is 0.24 times (for example, 4.6 µm) the sub-pixel pitch as a more preferable configuration.

A gap dt in the row direction between the second semiconductor film 25*b* and the bottom surface BF of the contact hole CHa is less than 0.19 times the sub-pixel pitch dp. In FIG. 2 and FIG. 3, the gap is 0.18 times (for example, 3.5 µm) the sub-pixel pitch as a more preferable configuration.

A width of the drain electrode DR in the row direction is 0.38 or more times the sub-pixel pitch dp. In FIG. 2 and FIG. 3, the width is 0.42 times (for example, 8.1 µm) the sub-pixel pitch as a more preferable configuration.

A width of the pixel electrode in the row direction is 0.68 or more times the sub-pixel pitch dp. In FIG. 2 and FIG. 3, the width is 0.72 times (for example, 13.8 µm) the sub-pixel pitch as a more preferable configuration.

A width of the data signal line SL is 0.16 or more times the sub-pixel pitch dp. In FIG. 2 and FIG. 3, the width is 0.19 times (for example, 3.6 □m) the pixel pitch as a more preferable configuration.

Part Cg of the bottom surface BF of the contact hole CHa (an end portion along a Y direction on the second semiconductor film 25*b* side) does not overlap the drain electrode DR.

Figure 4:
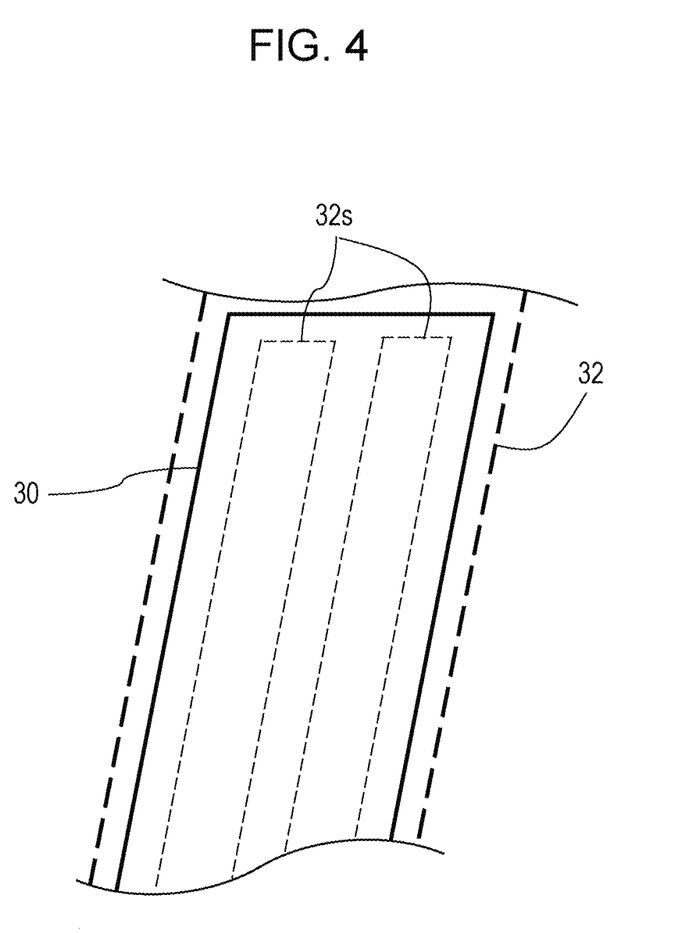
FIG. 4 is a plan view showing a configuration of a pixel electrode and a common electrode according to the embodiment 1.

FIG. 4 is a plan view showing a configuration of the pixel electrode and the common electrode according to the embodiment 1. As shown in FIG. 4, the pixel electrode 30 and the common electrode 32 face each other through the inorganic insulating film 31, and a slit 32*s* is formed in the common electrode 32 (FFS mode).

Figure 5:
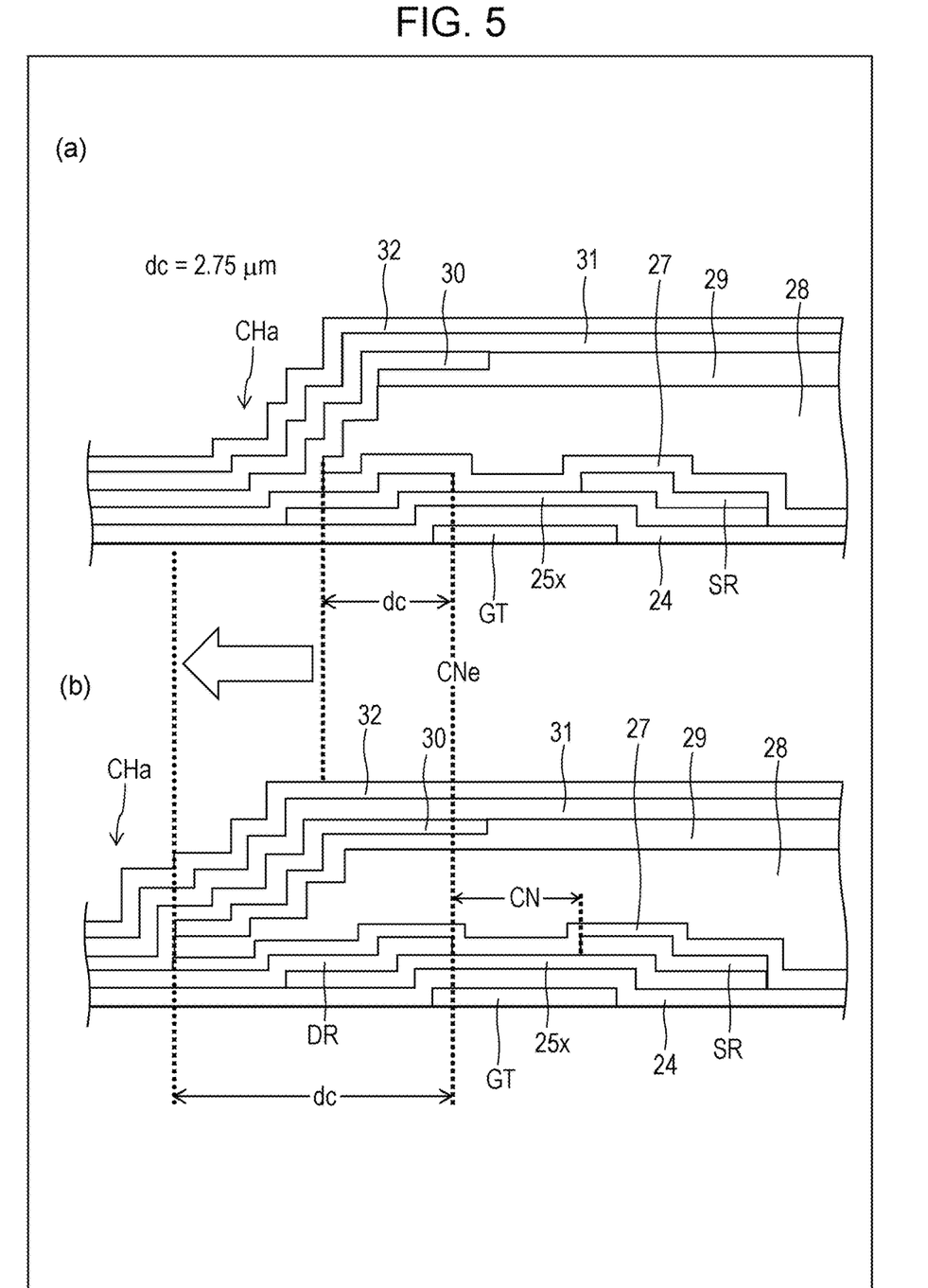
FIG. 5 is a cross sectional showing a position of a contact hole in the embodiment 1.
Figure 6:
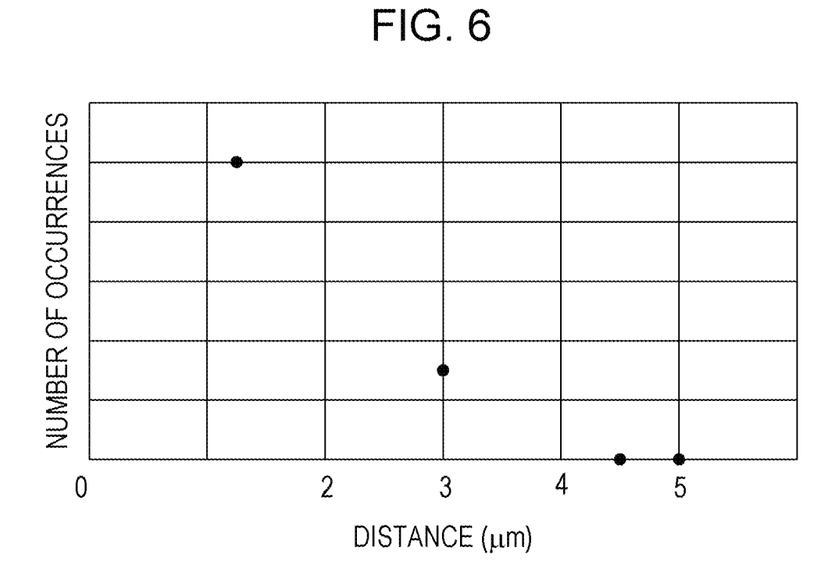
FIG. 6 is a graph showing a relationship between the position of the contact hole in FIG. 5 and the number of occurrences of pixel defects.

FIG. 5 is a cross sectional showing a position of the contact hole (a position of the bottom surface), and FIG. 6 is a graph showing a relationship between the position of the contact hole in FIG. 5 and the number of occurrences of pixel defects. As shown in FIG. 5(*a*) and FIG. 6, it can be seen that the pixel defects increase as a distance between the transistor and the contact hole is reduced for higher definition. At dc=2.75 µm, the number of occurrences of the pixel defects is high, but at dc=2.96 µm, the number of occurrences of the pixel defects significantly decreases, and as shown in FIG. 5(*b*), when dc=4.5 µm, it can be seen that the number of occurrences becomes almost zero. That is, by configuring the active matrix substrate 3 as shown in FIG. 2 and FIG. 3, higher definition can be achieved while suppressing the occurrences of the pixel defects.

[Embodiment 2]

An active matrix substrate of an embodiment 2 includes a TFT (pixel TFT) for each pixel. For example, an oxide semiconductor TFT using an In—Ga—Zn—O based semiconductor film as an active layer is used as the pixel TFT.

Part or all of peripheral drive circuits may be integrally formed on the same substrate as the pixel TFT. Such an active matrix substrate is called a driver monolithic active matrix substrate. In the driver monolithic active matrix substrate, the peripheral drive circuit is provided in an area (non-display area or frame area) other than an area (display area) including a plurality of pixels. For example, a crystalline silicon TFT having a polycrystalline silicon film as the active layer is used as a TFT (circuit TFT) configuring the peripheral drive circuit. As described above, when the oxide semiconductor TFT is used as the pixel TFT and the crystalline silicon TFT is used as the circuit TFT, power consumption can be reduced in the display area, and the frame area can be made smaller.

Figure 7:
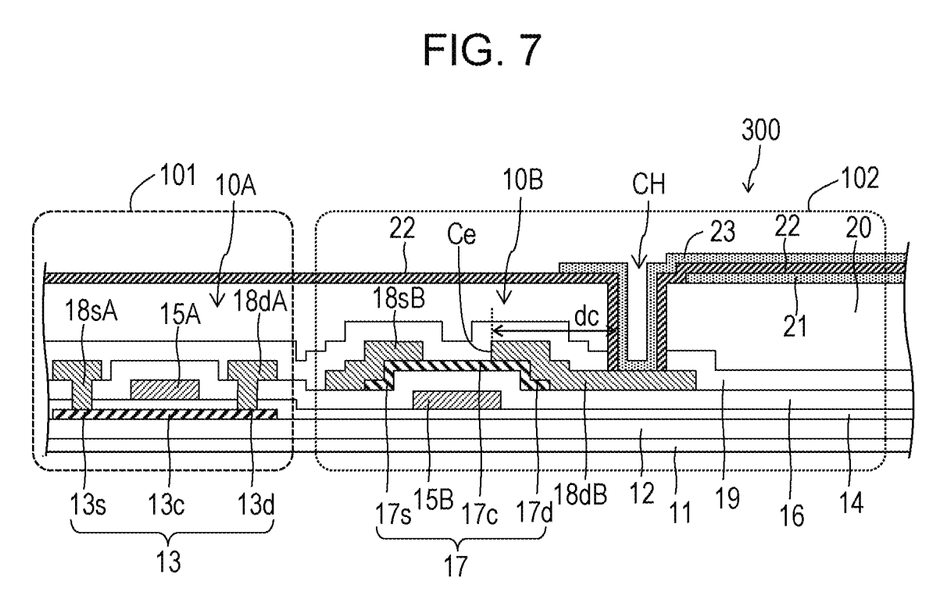
FIG. 7 is a cross-sectional view showing a configuration of an embodiment 2.

FIG. 7 is a cross-sectional view showing the configuration of the active matrix substrate of the embodiment 2. As shown in FIG. 7, in an active matrix substrate 300, a thin film transistor 10A is formed in a drive circuit formation area 101 as the circuit TFT, and a thin film transistor 10B is formed in each pixel of the display area 102 as the pixel TFT.

The active matrix substrate 300 includes a substrate 11, a base film 12 formed on a surface of the substrate 11, the thin film transistor 10A formed on the base film 12, and the thin film transistor 10B formed on the base film 12. The thin film transistor 10A has an active area mainly including crystalline silicon. The thin film transistor 10B has an active area mainly including an oxide semiconductor.

The thin film transistor 10A and the thin film transistor 10B are integrally formed on the substrate 11. The term "active area" as used herein refers to an area in which a channel is formed in a semiconductor layer to be an active layer of a TFT.

The thin film transistor 10A has a crystalline silicon semiconductor layer (for example, a low temperature polysilicon layer) 13 formed on the base film 12, a first insulating layer 14 covering the crystalline silicon semiconductor layer 13, and a gate electrode 15A provided on the first insulating layer 14. A portion of the first insulating layer 14 located between the crystalline silicon semiconductor layer 13 and the gate electrode 15A functions as a gate insulating film of the thin film transistor 10A. The crystalline silicon semiconductor layer 13 has an area (active area) 13c in which a channel is formed, and a source area 13s and a drain area 13d located on both sides of the active area.

In this example, a portion of the crystalline silicon semiconductor layer 13 overlapping the gate electrode 15A through the first insulating layer 14 is the active area 13c. The thin film transistor 10A also has a source electrode 18sA and a drain electrode 18dA connected to the source area 13s and the drain area 13d, respectively. The source and drain electrodes 18sA and 18dA are provided on an insulating film (here, a second insulating layer 16) covering the gate electrode 15A and the crystalline silicon semiconductor layer 13, and may be connected to the crystalline silicon semiconductor layer 13 in the contact hole formed in the insulating film.

The thin film transistor 10B has a gate electrode 15B provided on the base film 12, the second insulating layer 16 covering the gate electrode 15B, and an oxide semiconductor layer 17 (first semiconductor film) disposed on the second insulating layer 16.

As shown in FIG. 7, the first insulating layer 14 which is the gate insulating film of the thin film transistor 10A may be extended to an area in which the thin film transistor 10B is to be formed. In this case, the oxide semiconductor layer 17 may be formed on the first insulating layer 14. A portion of the second insulating layer 16 located between the gate electrode 15B and the oxide semiconductor layer 17 functions as a gate insulating film of the thin film transistor 10B.

The oxide semiconductor layer 17 has an area (active area) 17c in which a channel is formed, and a source contact area 17s and a drain contact area 17d respectively located on both sides of the active area. In this example, a portion of the oxide semiconductor layer 17 overlapping the gate electrode 15B through the second insulating layer 16 is an active area 17c. The thin film transistor 10B further has a source electrode 18sB and a drain electrode 18dB connected to the source contact area 17s and the drain contact area 17d, respectively. In addition, a configuration which does not provide the base film 12 on the substrate 11 is also possible.

The thin film transistors 10A and 10B are covered with a passivation film 19 and a planarization film 20. In the thin film transistor 10B functioning as a pixel TFT, the gate electrode 15B is connected to a gate bus line (not shown), the source electrode 18sB is connected to a source bus line (not shown), and the drain electrode 18dB is connected to a pixel electrode 23. In this example, the drain electrode 18dB is connected to the corresponding pixel electrode 23 in a contact hole CH formed in the passivation film 19 and the planarization film 20. A video signal is supplied to the source electrode 18sB through the source bus line, and necessary charges are written to the pixel electrode 23 based on a gate signal from the gate bus line.

Also in the embodiment 2, in a plan view, the distance dc in the row direction (lateral direction in FIG. 7) from a drain electrode-side edge Ce of a channel of the transistor 10B to a bottom surface of the contact hole CH is 0.154 or more times a sub-pixel pitch in the row direction, more preferably 0.234 times.

As shown in FIG. 7, a transparent conductive layer 21 may be formed on the planarization film 20 as a common electrode, and a third insulating layer 22 may be formed between the transparent conductive layer (common electrode) 21 and the pixel electrode 23. In this case, the pixel electrode 23 may be provided with a slit-like opening. Such active matrix substrate 300 may be applied to, for example, the display device in the fringe-field switching (FFS) mode. The FFS mode is a lateral electric field mode in which a pair of electrodes are provided on one of the substrates and an electric field is applied to liquid crystal molecules in a direction parallel to a substrate surface (lateral direction).

In this example, an electric field represented by lines of electric force is generated which is emitted from the pixel electrode 23 through the liquid crystal layer (not shown) and further through the slit-like opening of the pixel electrode 23 to the common electrode 21. The electric field has a lateral component to the liquid crystal layer. Consequently, the lateral electric field can be applied to the liquid crystal layer. The lateral electric field mode has an advantage that a wide viewing angle can be realized as compared with a vertical electric field mode because liquid crystal molecules do not rise from the substrate.

In the example shown in FIG. 7, the thin film transistor 10A has a top gate structure in which the crystalline silicon semiconductor layer 13 is disposed between the gate electrode 15A and the substrate 11 (base film 12). Meanwhile, the thin film transistor 10B has a bottom gate structure in which the gate electrode 15B is disposed between the oxide semiconductor layer 17 and the substrate 11 (base film 12). By employing such a structure, when the two types of thin film transistors 10A and 10B are integrally formed on the same substrate 11, it is possible to more effectively suppress an increase in the number of manufacturing processes and manufacturing costs.

The TFT structures of the thin film transistor 10A and the thin film transistor 10B are not limited to the above. For example, the thin film transistors 10A and 10B may have the same TFT structure. The thin film transistor 10A may have the bottom gate structure, and the thin film transistor 10B may have the top gate structure. In a case of the bottom gate structure, a channel etch type as in the thin film transistor 10A or an etch stop type may be used. Further, a bottom contact type in which the source electrode and the drain electrode are located at the bottom of the semiconductor layer may be used.

The second insulating layer 16 which is the gate insulating film of the thin film transistor 10B may be extended to an area in which the thin film transistor 10A is formed, and may function as an interlayer insulating film covering the gate electrode 15A of the thin film transistor 10A and the crystalline silicon semiconductor layer 13. When the interlayer insulating film of the thin film transistor 10A and the gate insulating film of the thin film transistor 10B are formed in the same layer (second insulating layer) 16 as described above, the second insulating layer 16 may have a laminated structure.

The gate electrode 15A of the thin film transistor 10A and the gate electrode 15B of the thin film transistor 10B may be formed in the same layer. The source and drain electrodes 18sA and 18dA of the thin film transistor 10A and the source and drain electrodes 18sB and 18dB of the thin film transistor 10B may be formed in the same layer. "Formed in the same layer" means being formed using the same film (conductive film). Accordingly, the increase in the number of manufacturing processes and the manufacturing costs can be suppressed.

The oxide semiconductor layer 17 in the embodiment 2 includes, for example, an In—Ga—Zn—O based semiconductor (hereinafter, referred to as "In—Ga—Zn—O based semiconductor"). The In—Ga—Zn—O based semiconductor is a ternary oxide of indium (In), gallium (Ga) and zinc (Zn), and the ratio (composition ratio) of In, Ga and Zn is not particularly limited, includes, for example, In:Ga:Zn=2:2:1, In:Ga:Zn=1:1:1, In:Ga:Zn=1:1:2, and the like.

The In—Ga—Zn—O based semiconductor may be amorphous or crystalline. As a crystalline In—Ga—Zn—O based semiconductor, the crystalline In—Ga—Zn—O based semiconductor in which a c-axis is oriented substantially vertically to a layer surface is preferable. The crystal structure of such In—Ga—Zn—O based semiconductor is disclosed, for example, in Japanese Unexamined Patent Application Publication No. 2012-134475. For reference, the entire disclosure of Japanese Unexamined Patent Application Publication No. 2012-134475 is cited herein.

The oxide semiconductor layer 17 may include another oxide semiconductor instead of the In—Ga—Zn—O based semiconductor. For example, a Zn—O based semiconductor (ZnO), an In—Zn—O based semiconductor, a Zn—Ti—O based semiconductor (ZTO), a Cd—Ge—O based semiconductor, a Cd—Pb—O based semiconductor, a CdO (cadmium oxide), a Mg—Zn—O based semiconductor, an In—Sn—Zn—O based semiconductor (for example, $In_2O_3$—$SnO_2$—ZnO), an In—Ga—Sn—O based semiconductor, or the like may be included.

SUMMARY

Aspects according to the present invention can include following aspects.

Aspect 1: An active matrix substrate including: a first semiconductor film corresponding to one of two sub-pixels adjacent to each other in a row direction; a second semiconductor film corresponding to the other of two sub-pixels; a transistor using part of the first semiconductor film as a channel in the row direction; and a pixel electrode connected to a drain electrode of the transistor through a contact hole, in which, in a plan view, a distance in the row direction from a drain electrode-side edge of the channel to a bottom surface of the contact hole is 0.15 or more times a sub-pixel pitch in the row direction.

Aspect 2: The active matrix substrate according to aspect 1, for example, in which the distance is 0.23 or more times the sub-pixel pitch.

Aspect 3: The active matrix substrate according to aspect 1 or 2, for example, in which the contact hole has a forward tapered shape and penetrates an interlayer insulating film.

Aspect 4: The active matrix substrate according to aspect 3, for example, in which the distance is 1.2 or more times a thickness of the interlayer insulating film.

Aspect 5: The active matrix substrate according to any one of aspects 1 to 4, for example, in which a length of the first semiconductor film in the row direction is 0.45 or more times the sub-pixel pitch.

Aspect 6: The active matrix substrate according to any one of aspects 1 to 5, for example, in which the first and second semiconductor films are arranged in the row direction with a gap less than 0.48 times the sub-pixel pitch.

Aspect 7: The active matrix substrate according to any one of aspects 1 to 6, for example, in which a width of the bottom surface in the row direction is 0.21 or more times the sub-pixel pitch.

Aspect 8: The active matrix substrate according to any one of aspects 1 to 7, for example, in which a gap between the second semiconductor film and the bottom surface in the row direction is less than 0.19 times the sub-pixel pitch.

Aspect 9: The active matrix substrate according to any one of aspects 1 to 8, for example, in which a width of the drain electrode in the row direction is 0.38 or more times the sub-pixel pitch.

Aspect 10: The active matrix substrate according to any one of aspects 1 to 9, for example, in which a width of the pixel electrode in the row direction is 0.68 or more times the sub-pixel pitch.

Aspect 11: The active matrix substrate according to any one of aspects 1 to 10, for example, in which a data signal line is connected to a source electrode of the transistor, and a width of the data signal line is 0.16 or more times a pixel pitch.

Aspect 12: The active matrix substrate according to any one of aspects 1 to 11, for example, in which the interlayer insulating film includes an inorganic insulating film and an organic insulating film.

Aspect 13: The active matrix substrate according to any one of aspects 1 to 12, for example, in which part of the bottom surface of the contact hole does not overlap the drain electrode.

Aspect 14: The active matrix substrate according to any one of aspects 1 to 13, for example, further including a common electrode facing the pixel electrode through an inorganic insulating film above the pixel electrode, in which a slit is formed in at least one of the pixel electrode and the common electrode.

Aspect 15: The active matrix substrate according to any one of aspects 1 to 14, for example, in which the number of sub-pixels per inch is 1200 or more.

Aspect 16: The active matrix substrate according to any one of aspects 1 to 15, for example, in which the first and second semiconductor films are formed of an oxide semiconductor.

Aspect 17: The active matrix substrate according to any one of aspects 1 to 18, for example, further including a third semiconductor film formed of a material different from the first and second semiconductor films.

Aspect 18: The active matrix substrate according to aspect 17, for example, in which one of the transistor and a transistor using the third semiconductor film as a channel is a bottom gate structure, and the other is a top gate structure.

Aspect 19: A liquid crystal display device including the active matrix substrate according to, for example, aspects 1 to 18.

The present invention is not limited to the embodiments described above, and embodiments obtained by appropriately combining the technical solutions respectively disclosed in different embodiments are also included in the technical scope of the present invention. Furthermore, new technical features can be formed by combining the technical solutions disclosed in each embodiment.

REFERENCE SIGNS LIST

3 ACTIVE MATRIX SUBSTRATE
10 LIQUID CRYSTAL PANEL

GL SCANNING SIGNAL LINE
SL DATA SIGNAL
DR DRAIN ELECTRODE
CHa, CHb, CH CONTACT HOLE
dp SUB-PIXEL PITCH
25a FIRST SEMICONDUCTOR FILM
25b SECOND SEMICONDUCTOR FILM

The invention claimed is:

1. An active matrix substrate comprising:
a first semiconductor film corresponding to one of two sub-pixels adjacent to each other in a row direction;
a second semiconductor film corresponding to the other of two sub-pixels;
a transistor using part of the first semiconductor film as a channel in the row direction; and
a pixel electrode connected to a drain electrode of the transistor through a contact hole,
wherein, in a plan view, a distance in the row direction from a drain electrode-side edge of the channel to a bottom surface of the contact hole is 0.15 or more times a sub-pixel pitch in the row direction.

2. The active matrix substrate according to claim 1, wherein the distance is 0.23 or more times the sub-pixel pitch.

3. The active matrix substrate according to claim 1, wherein the contact hole has a forward tapered shape and penetrates an interlayer insulating film.

4. The active matrix substrate according to claim 3, wherein the distance is 1.2 or more times a thickness of the interlayer insulating film.

5. The active matrix substrate according to claim 3, wherein the interlayer insulating film includes an inorganic insulating film and an organic insulating film.

6. The active matrix substrate according to claim 1, wherein a length of the first semiconductor film in the row direction is 0.45 or more times the sub-pixel pitch.

7. The active matrix substrate according to claim 1, wherein the first and second semiconductor films are arranged in the row direction with a gap less than 0.48 times the sub-pixel pitch.

8. The active matrix substrate according to claim 1, wherein a width of the bottom surface in the row direction is 0.21 or more times the sub-pixel pitch.

9. The active matrix substrate according to claim 1, wherein a gap between the second semiconductor film and the bottom surface in the row direction is less than 0.19 times the sub-pixel pitch.

10. The active matrix substrate according to claim 1, wherein a width of the drain electrode in the row direction is 0.38 or more times the sub-pixel pitch.

11. The active matrix substrate according to claim 1, wherein a width of the pixel electrode in the row direction is 0.68 or more times the sub-pixel pitch.

12. The active matrix substrate according to claim 1, wherein a data signal line is connected to a source electrode of the transistor, and a width of the data signal line is 0.16 or more times a pixel pitch.

13. The active matrix substrate according to claim 1, wherein part of the bottom surface of the contact hole does not overlap the drain electrode.

14. The active matrix substrate according to claim 1, further comprising:
a common electrode facing the pixel electrode through an inorganic insulating film above the pixel electrode,
wherein a slit is formed in at least one of the pixel electrode and the common electrode.

15. The active matrix substrate according to claim 1, wherein the number of sub-pixels per inch is 1200 or more.

16. The active matrix substrate according to claim 1, wherein the first and second semiconductor films are formed of an oxide semiconductor.

17. The active matrix substrate according to claim 1, further comprising:
a third semiconductor film formed of a material different from the first and second semiconductor films.

18. The active matrix substrate according to claim 17, wherein one of the transistor and a transistor using the third semiconductor film as a channel is a bottom gate structure, and the other is a top gate structure.

19. A liquid crystal display device comprising the active matrix substrate according to claim 1.

* * * * *